United States Patent
Conboy et al.

(10) Patent No.: US 6,411,859 B1
(45) Date of Patent: Jun. 25, 2002

(54) FLOW CONTROL IN A SEMICONDUCTOR FABRICATION FACILITY

(75) Inventors: Michael R. Conboy, Austin; Patrick J. Ryan, Kyle; Elfido Coss, Jr., Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/143,322

(22) Filed: Aug. 28, 1998

(51) Int. Cl.[7] .............................................. G06F 19/00
(52) U.S. Cl. ...................................... 700/101; 700/214
(58) Field of Search ................................. 700/121, 112, 700/101, 100, 99, 113, 103, 115, 213, 214, 226

(56) References Cited

U.S. PATENT DOCUMENTS

| | | | |
|---|---|---|---|
| 5,551,830 A | * 9/1996 | Watanabe et al. | 414/807 |
| 5,696,689 A | * 12/1997 | Okumura et al. | 700/121 |
| 5,751,581 A | * 5/1998 | Tau et al. | 700/115 |
| 5,838,566 A | * 11/1998 | Conboy et al. | 700/115 |
| 5,975,740 A | * 11/1999 | Lin et al. | 700/99 |
| 6,035,245 A | * 3/2000 | Conboy et al. | 700/214 |
| 6,050,768 A | * 4/2000 | Iwasaki et al. | 414/222.01 |
| 6,108,585 A | * 8/2000 | Ryan et al. | 700/112 |
| 6,129,496 A | * 10/2000 | Iwasaki et al. | 414/222.01 |
| 6,131,052 A | * 10/2000 | Ban et al. | 700/121 |
| 6,151,533 A | * 11/2000 | Iwasaki et al. | 700/214 |
| 6,169,935 B1 | * 1/2001 | Iwasaki et al. | 700/214 |
| 6,175,777 B1 | * 6/2001 | Kim | 700/121 |

\* cited by examiner

*Primary Examiner*—William Grant
*Assistant Examiner*—Edward F. Gain, Jr.

(57) ABSTRACT

Techniques for controlling the flow of wafer lots in a semiconductor fabrication facility having multiple storage locations and a fabrication facility employing such techniques are provided. A process and system for controlling the flow of wafer lots within a semiconductor fabrication facility, in accordance with one embodiment of the invention, includes determining a first storage location for a wafer lot, determining, prior to moving the wafer lot, an availability condition of the first storage location based on a condition level of the first storage location and a priority of the wafer lot, and storing the wafer lot in the storage location if the location is available and storing the wafer lot in an alternate location if the storage location is unavailable. The storage location may, for example, be a stocker. In this manner, the invention may, for example, advantageously anticipate or sense bubbles or log jams of wafer lots in a fabrication facility and redirect wafer lots in order to avoid or reduce any bubble effect. This can, for example, significantly increase the throughput of wafers through the fabrication facility.

35 Claims, 6 Drawing Sheets

| Condition Level | Priority Level | Availability Condition |
|---|---|---|
| IV | All (Hot, Medium, Normal) | Unavailable |
| III | Hot | Available |
| | Medium, Normal | Unavailable |
| II | Hot and Medium | Available |
| | Normal | Unavailable |
| III | All | Available |

| Condition Level | Storage location Condition |
|---|---|
| IV | Capacity = PMAX, Operability=Down |
| III | 0.75≤Capacity<PMAX, Operability=Down-15 min. |
| II | 0.5≤Capacity<0.75PMAX, Operability=Down-30 min. |
| III | Capacity<0.5PMAX |

FIG.4

| Priority Level |
|---|
| Hot |
| Medium |
| Normal |

| Condition Level | Priority Level | Availability Condition |
|---|---|---|
| IV | All (Hot, Medium, Normal) | Unavailable |
| III | Hot<br>Medium, Normal | Available<br>Unavailable |
| II | Hot and Medium<br>Normal | Available<br>Unavailable |
| III | All | Available |

…

FLOW CONTROL IN A SEMICONDUCTOR FABRICATION FACILITY

FIELD OF THE INVENTION

The present invention generally relates to semiconductor fabrication and, more particularly, to a method for controlling the flow of wafer lots within the semiconductor fabrication facility and a fabrication facility employing such method.

BACKGROUND OF THE INVENTION

Semiconductor manufactures compete in a highly competitive and capital-intensive industry. A state-of-the-art semiconductor fabrication plant typically includes hundreds of different fabrication tools and can cost $1 billion or more. New plants can also become obsolete relatively quickly as the dimensions of semiconductor devices decrease.

FIG. 1 schematically illustrates, albeit in a relatively simple form, a conventional semiconductor fabrication plant 100. The fabrication plant 100 includes multiple fabrication areas or bays 110 interconnected by a path 120, such as a conveyor belt. Each bay 110 generally includes the requisite processing tools (interconnected by a subpath) to process semiconductor wafers for a particular purpose, such as photolithography, chemical-mechanical polishing, or chemical vapor deposition, for example. Material stockers 130 generally lie about the plant 100 and store semiconductor wafers waiting to be processed. The wafers are typically stored in cassettes each of which can hold up to 25 wafers. Each material stocker 130 typically services two or more bays 110 and can hold hundreds of cassettes. While not shown, the semiconductor fabrication plant 100, including the bays 110, material stockers 130 and the interconnecting path 120, typically operates under control of a host system, usually a distributed computer system running a factory management program, such as WorkStream Open sold by Consilium, Inc.

A typical semiconductor fabrication plant, such as the one described above, handles the processing of thousands of wafers at any given time. The wafers are typically divided into batches which undergo different processing flows. During processing, bubbles or log jams of wafer lots typically occur. Such bubbles may occur for a variety of reasons. For instance, the process flows of different wafer batches may meet at a particular area, such as a bay, stocker or processing tool, and cause a bubble at the particular area. Bubbles not only affect processing at the bubble point, but also cause a ripple effect which slows upstream processing as well. This significantly degrades wafer throughput in the fabrication facility.

SUMMARY OF THE INVENTION

The present invention generally provides techniques for controlling the flow of wafer lots in a semiconductor fabrication facility and a fabrication facility employing such techniques. The invention may, for example, advantageously anticipate or sense bubbles or log jams of wafer lots in a fabrication facility and redirect wafer lots in order to avoid or reduce any bubble effect. This can, for example, significantly increase the throughput of wafers through the fabrication facility.

A process and system for controlling the flow of wafer lots within a semiconductor fabrication facility, in accordance with one embodiment of the invention, includes determining a first storage location for a wafer lot, determining, prior to moving the wafer lot, an availability condition of the first storage location based on a condition level of the first storage location and a priority of the wafer lot, and storing the wafer lot in the storage location if the location is available and storing the wafer lot in an alternate location if the storage location is unavailable. The storage location may, for example, be a stocker or a buffer or bin associated with a bay or a processing tool.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 4 is a table illustrating exemplary condition levels in accordance with one embodiment of the invention;

FIG. 5 is a table illustrating exemplary priority levels in accordance with another embodiment of the invention;

FIG. 6 is a table illustrating exemplary acceptance rules in accordance with another embodiment of the invention.

Figure 1:
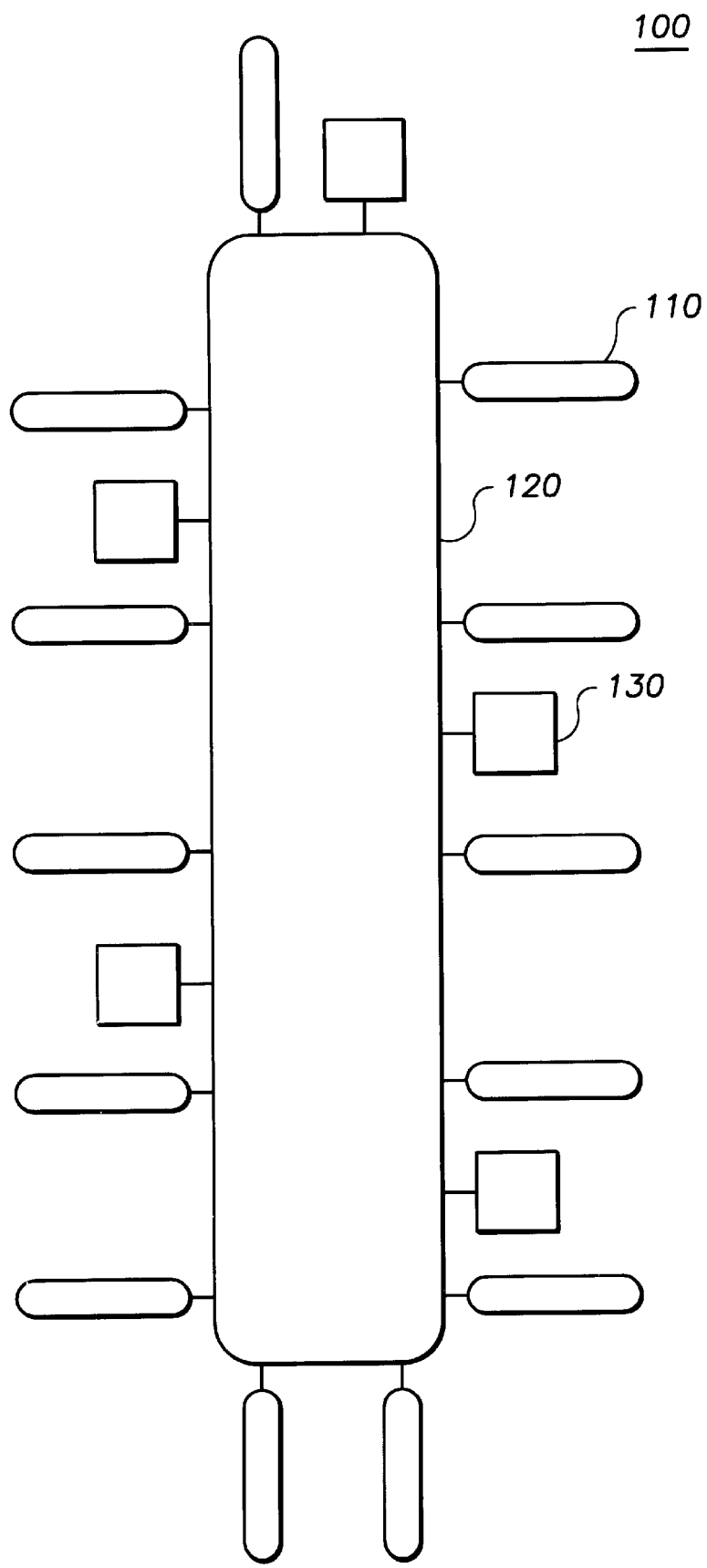
FIG. 1 schematically illustrates a conventional semiconductor fabrication facility.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally provides techniques for controlling the flow of wafer lots in a semiconductor fabrication facility having multiple storage locations, such as stockers, and/or bins or buffers associated with processing tools or bays. While the present invention is not so limited, a better understanding of the invention will be found by reading the detailed description and exemplary embodiments which follow.

Figure 2:
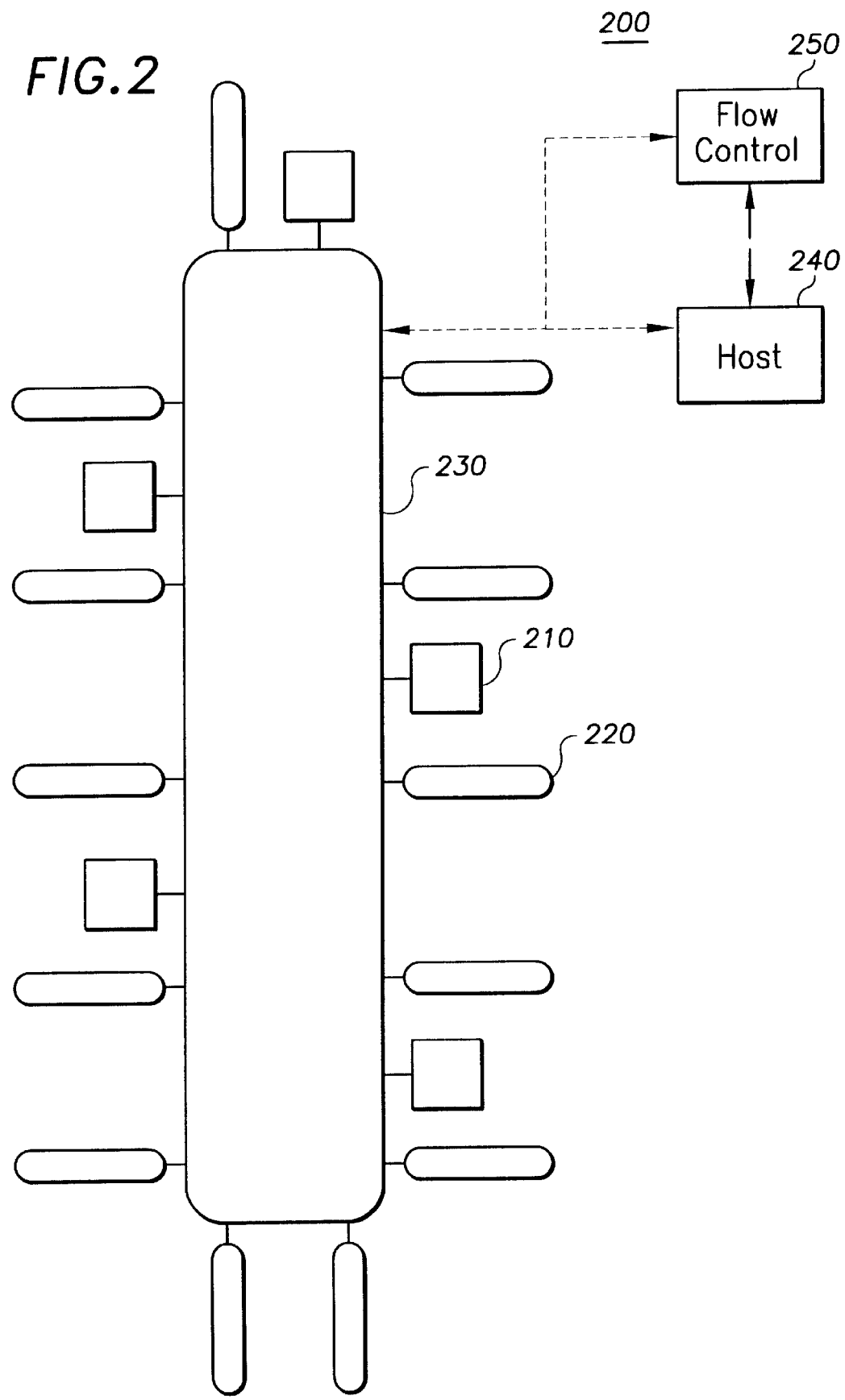
FIG. 2 schematically illustrates an exemplary semiconductor fabrication facility in accordance with one embodiment of the invention.

FIG. 2 illustrates an exemplary semiconductor fabrication facility having a flow control system in accordance with an illustrative embodiment of the invention. The semiconductor fabrication facility 200 generally includes multiple stockers 210 and multiple bays and processing tools 220, connected by one or more paths 230 and operating under control of the host system 240, such as Workstream Open. For fabricating wafers, the facility includes a number of different storage locations for storing wafers. Such storage locations may, for example, include the stockers 210 as well as other storage areas, such as buffers and bins for the processing tools and bays, etc. The list of storage locations is provided by way of example and not of limitation. The invention is not limited to any type of storage area for wafers.

In accordance with the invention, the exemplary facility 200 further includes a flow control system for controlling the flow of wafer lots between storage locations within the facility 200. The exemplary flow control system 250 generally receives requests to move wafer lots to particular storage locations, determines availability conditions of the storage locations based on condition levels of the storage locations and priority levels of wafer lots, and responds to the move requests in accordance with the availability conditions. In this manner, the flow control system 250 can anticipate or prevent, bubbles or backlogs of wafer lots within the semiconductor fabrication facility 200.

The flow control system 250 may be implemented in a number of different manners. The flow control system 250 is illustrated as being separate from the host system 240 by way of illustration only. The flow control system 250 may be implemented as a subsystem of the host system 240 or a stand alone module which interfaces with the host system 240. A flow control system 250 may also be implemented in an agent scheme with a flow control agent being associated with each wafer lot. A number of other implementations techniques will be readily understood by one skilled in the art upon reading the description which follows.

Figure 3:
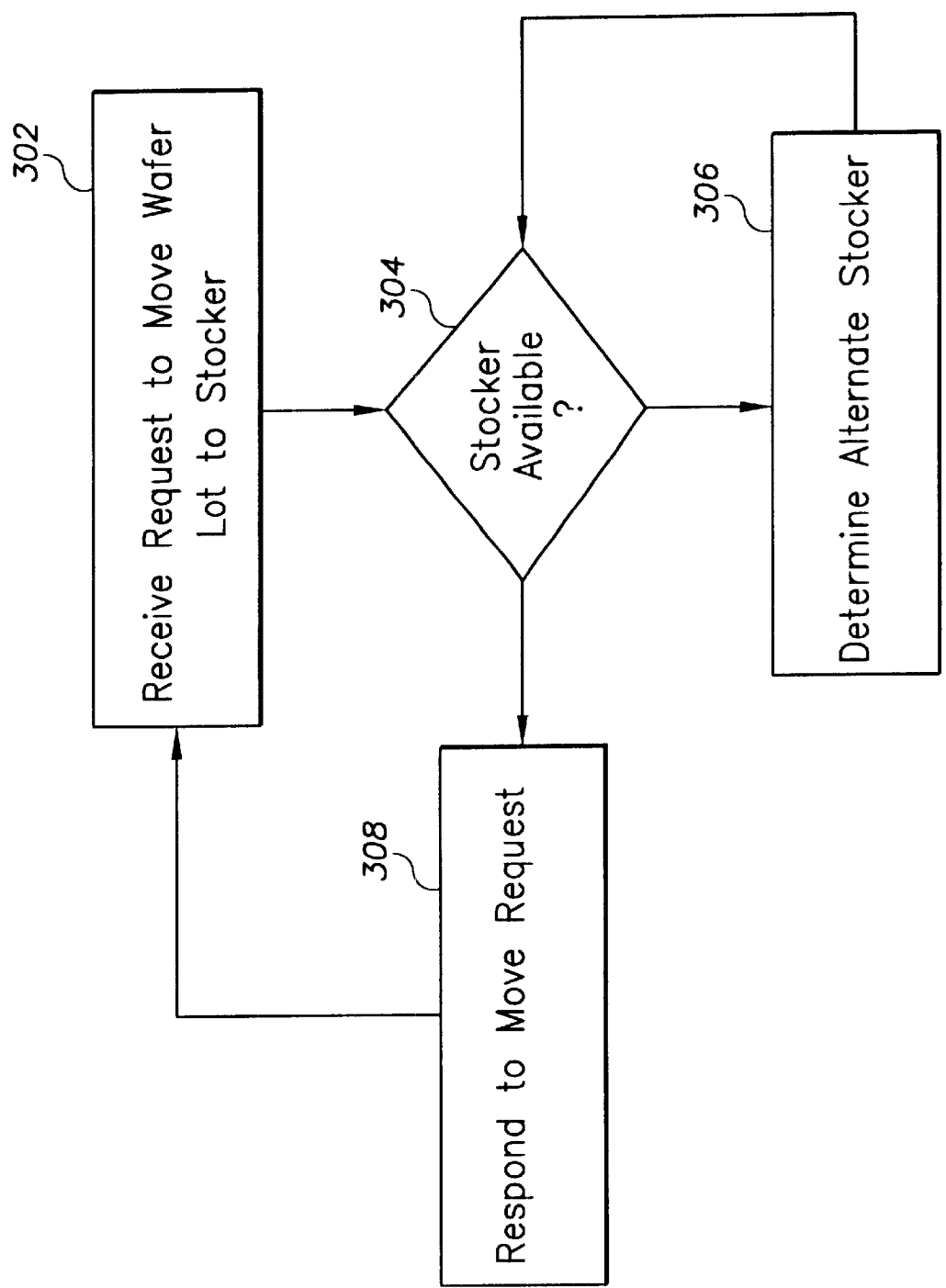
FIG. 3 illustrates an exemplary process in accordance with another embodiment of the invention.

FIG. 3 illustrates an exemplary process for controlling the flow of wafer lots within a semiconductor fabrication facility having multiple storage locations. It should be appreciated, this process may be performed by the flow control system discussed above. According to this illustrative process, a request to move a wafer lot to a particular storage location is received as indicated at block 302. The request may, for example, be received by the flow control system from a host system.

Next, prior to moving the wafer lot, the flow control system determines an availability condition (e.g., available or unavailable) for the storage location, as indicated at block 304. The determination is typically based on a condition level of the particular storage location and a priority level of the wafer lot and may, for example, be performed using a set of acceptance rules for each condition level and priority level. An exemplary acceptance rule set will be discussed below. The flow control system then responds (e.g., to the host system) in accordance with the availability condition of the storage location, as indicated at block 308. In the example embodiment, if the availability condition of the storage location indicates that the storage location is available, then the flow controller sends a response to the host system, at block 308, allowing the move request. The response message may further include an estimated delivery time (e.g., the time at which the wafer lot will arrive at the storage location). The host system may then store the wafer lot in the particular storage location.

If the particular storage location is not available, an alternate storage location is determined as indicated at block 306. An alternate storage location is typically determined based on the present location of the wafer lot as well as the proximity of an alternate storage location to the particular storage location which was unavailable. This may be done in a number of manners. For instance, each storage location may be associated with an number of potential alternate storage locations. For example, a list of alternate storage locations for each storage location may be stored by the storage location or the host system for access by a flow control system. The flow control system may then determine a first potential alternate storage location based upon the storage location's location relative to the wafer lot. The process flow then returns to block 304 and the flow control system determines an availability condition of the potential storage location. This may also be done according to a condition level of the potential alternate storage location and the priority level of the wafer lot, using for example, acceptance rules as discussed above.

If the potential alternate storage location is available, control moves to block 308 and the flow controller responds to the move request by, for example, sending a message denying the initial move request and identifying an available alternate storage location. The message may further include an estimate of delivery time. The host system may then store the wafer lot in the available alternate storage location. If the potential alternate storage location is not available, control moves back to block 306 where another potential alternate storage location is determined. In most cases, this loop will result in the wafer lot being moved to an alternate storage location close to the storage location first desired. In some instances, however, the most desirable alternate storage location may be the storage location in which the wafer lot is presently stored. In this case, the wafer lot may remain stored within the same storage location.

As noted above, the determination of storage location availability is based upon a condition level of the storage location and priority level of the wafer lot. FIGS. 4 and 5 illustrate exemplary tables of condition levels and priority levels. FIG. 4 is a table illustrating exemplary condition levels for a storage location. In accordance with this embodiment, each storage location may have one of four different condition levels. The condition level of a particular storage location may, for example, be periodically determined by the host system or flow control system and stored in a database accessible by either the host or flow control system. A condition level IV is associated with storage locations which are inoperable or down or which are already storing their physical maximum (PMAX) number of wafer lots. Condition level III represents a first threshold level for a storage location which is nearing its physical maximum. For example, condition level III may be associated with storage locations having current capacity levels between 0.75 PMAX and PMAX. Condition level III may also be associated with a storage location which is nearing a scheduled down time. For example, condition level III may be associated with storage locations which are within a predetermined time, such as fifteen minutes, of a scheduled down time. Condition level II may be an early warning level associated with storage locations having, for example, a wafer lot capacity between 0.5 PMAX and 0.75 PMAX. Condition level II may also serve as a early warning level for a scheduled down time. For example, condition level II may be associated with the storage location which is within 30 minutes of a scheduled down time. Condition level I may be associated with a storage location which is below 50% of PMAX and which is not scheduled or nearing any down time.

FIG. 5 illustrates a table of priority levels for a wafer lot. In accordance with this embodiment, each wafer lot is classified into one of three priority levels. The three priority levels include hot, medium, and normal. The priority levels are typically based upon the desired speed with which the particular wafer lot is desired to be moved through the fabrication facility. The priority level of a wafer lot may, e.g., be stored by the host system for access by the flow control system. The host system may also update wafer lot priority levels (e.g., based on an administrator's input) to allow the priority level of a given wafer lot to be changed during processing.

FIG. 6 illustrates an exemplary table of acceptance rules in accordance with one embodiment of the invention. In accordance with this embodiment, condition level IV storage locations have an availability condition of available for all wafer lot priority levels. For storage locations with condition level III, the availability condition is available only for wafer lots having a priority of hot. For storage locations having condition level II, the availability condition is available for both medium and high priority level wafer lots. Finally, condition level I storage locations have an availability condition of available for all wafer lot priority levels.

Figure 7:
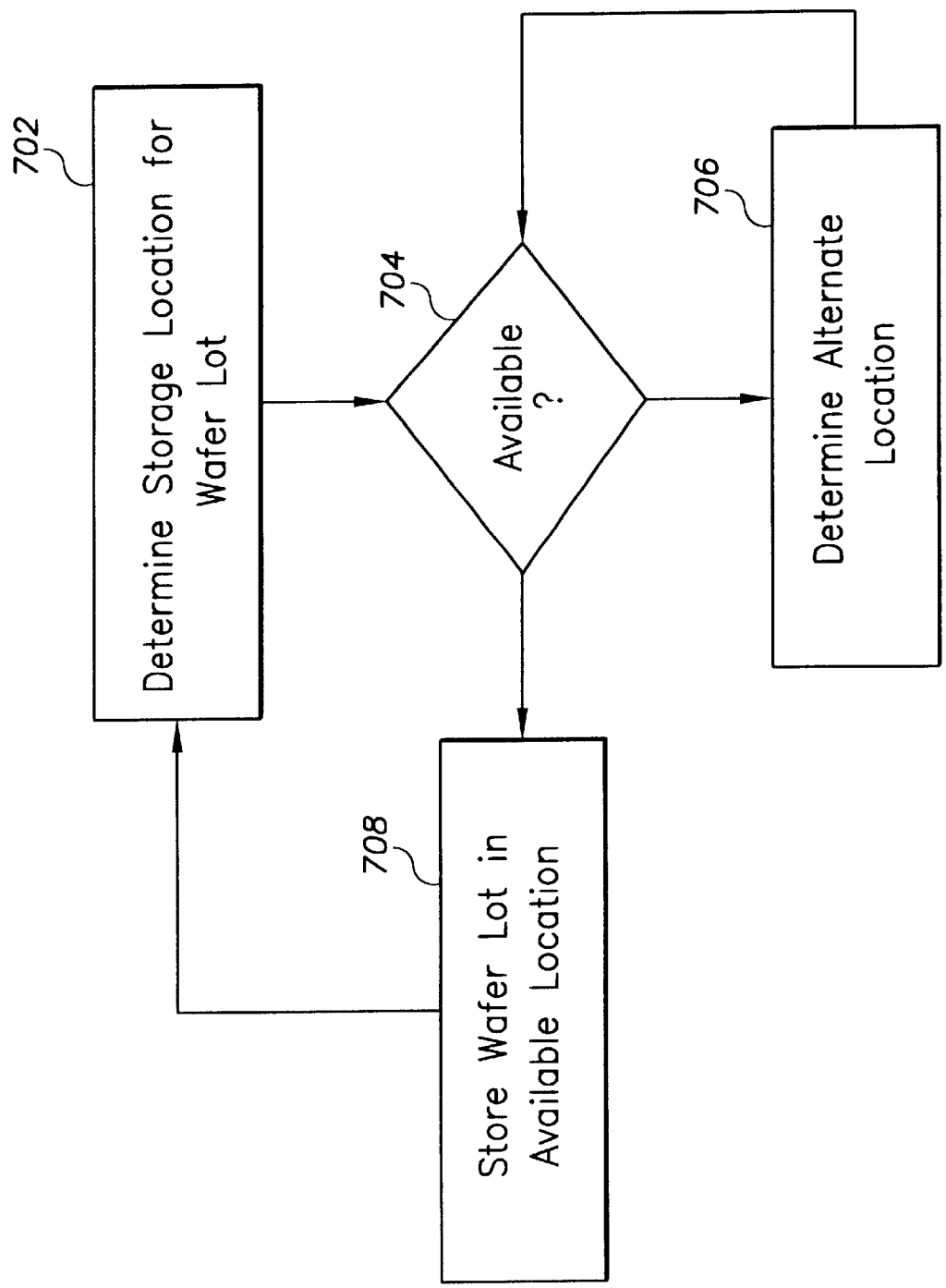
FIG. 7 illustrates another exemplary process in accordance with an embodiment of the invention.

FIG. 7 illustrates another exemplary flow control process in accordance with another embodiment of the invention. The flow of FIG. 7 illustrates a more general control flow in a fabrication facility. At block 702, a storage location is determined for a wafer lot. This is usually performed by a host system based on the fabrication process flow for the wafer lot and typically includes determining the next processing tool (e.g., deposition chamber, polishing tool) for the wafer lot and determining a storage location associated with the tool (e.g., tool bin or buffer, stocker, etc.). At block 704, before moving the wafer lot to the determined storage location, an availability condition of the storage location is determined. This may be done by a flow controller based on a condition level of the storage location and a priority level of the wafer lot in a similar manner as discussed above.

If the availability condition indicates the storage location is available, the wafer lot is stored in the storage location, as indicated at blocks 704 and 708. If the availability condition indicates the storage location is unavailable, an alternate storage location and an availability condition of the storage location are determined, as indicated at blocks 706 and 704. This may be performed by a flow controller in a similar manner as discussed above. Further, the loop of blocks 706 and 704 may be repeated until an alternate storage location is identified. Once an available alternate storage location is determined, control moves to block 708 where the wafer lot is stored in the storage location. This includes moving the wafer lot if the location for storage is different than the current location of the wafer lot.

The above flow control system and process can improve the flow of wafer lots and increase wafer throughput in a semiconductor fabrication facility having multiple storage locations. The flow control system and process may, for example, advantageously anticipate or sense bubbles or log jams of wafer lots in the storage locations and redirect wafer lots in order to avoid or reduce any bubble effect. Moreover, using storage location condition levels based on both capacity and operability enables the system to account for bubbles which may occur due to capacity overload as well as scheduled tool or storage location downtime.

As noted above, the present invention is applicable to a number of different flow control systems and fabrication facilities which include a number of different storage locations. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process for controlling the flow of wafer lots within a semiconductor fabrication facility having multiple storage locations, comprising:
   determining a first storage location for a wafer lot;
   determining, before moving the wafer lot to the first storage location, whether the first storage location is available based on a condition level of the first storage location and a priority level of the wafer lot; and
   moving the wafer lot to the first storage location if the first storage location is available and moving the wafer lot to an alternate storage location if the first storage location is unavailable.

2. The process of claim 1, wherein determining the first storage location includes:
   determining a processing tool for the wafer lot; and
   determining a first storage location associated with the processing tool.

3. The process of claim 1, further including setting the condition level of the first storage location based on the capacity of the first storage location.

4. The process of claim 1, further including setting the condition level of the first storage location based on the operability of the first storage location.

5. The process of claim 1, wherein determining whether the first storage location is available includes using a set of acceptance rules defining the availability of a particular storage location for a particular priority level.

6. The process of claim 1, further including determining the alternate storage location by:
   (a) determining a potential storage location; and
   (b) determining whether the potential storage location is available based on a condition level of a second storage location and a priority level of the wafer lot.

7. The process of claim 6, further including repeating (a) and (b) until an available storage location is determined.

8. The process of claim 7, further including moving the wafer lot to the available storage location.

9. The process of claim 7, wherein the storage locations include stockers.

10. The process of claim 1, further including the step of defining the first storage location and the alternate storage location as separate stocking locations disposed within the fabrication facility.

11. The process of claim 10, wherein the step of moving the wafer lot to the alternate storage location occurs automatically if the first storage location is unavailable.

12. The process of claim 1, wherein the step of moving the wafer lot to the alternate storage location occurs automatically if the first storage location is unavailable.

13. A semiconductor fabrication facility, comprising:
   multiple storage locations each having a condition level;
   multiple wafer lots each having a priority level; and
   a computer-implemented system for managing the flow of wafer lots in the fabrication facility, the system being configured to determine a first storage location for a wafer lot, determine, before moving the wafer lot to the first storage location, whether the first storage location is available based on a condition level of the first storage location and a priority level of the wafer lot, and move the wafer lot to the first storage location if the first storage location is available and moving the wafer lot to an alternate storage location if the first storage location is unavailable.

14. The facility of claim 13, wherein the system sets a condition level of a particular storage location based on the capacity of the particular storage location.

15. The facility of claim 13, wherein the system sets a condition level of a particular storage location based on the operability of the particular storage location.

16. The facility of claim 13, wherein the system determines whether the first storage location is available using a set of acceptance rules defining the availability of a particular storage location for a particular priority level.

17. The facility of claim 13, wherein, if the first storage location is unavailable, the system determines the alternate storage location by:

(a) determining a potential alternate storage location; and (b) determining whether the potential alternate storage location is available based on a condition level of the potential alternate storage location and a priority level of the wafer lot.

18. The facility of claim 17, wherein the system repeats (a) and (b) until an available storage location is determined.

19. The facility of claim 13, wherein the multiple storage locations include stockers.

20. The system of claim 13, wherein the multiple storage locations include separate stocking locations disposed within the fabrication facility.

21. The system of claim 13, wherein the wafer lot is moved automatically to the alternate storage location occurs if the first storage location is unavailable.

22. A process for controlling the flow of wafer lots within a semiconductor fabrication facility having multiple storage locations, comprising:

receiving a request to move a wafer lot to a first storage location;

determining, before moving the wafer lot to the first storage location, an availability condition of the first storage location based on a condition level of the first storage location and a priority level of the wafer lot; and responding to the request in accordance with the availability condition the first storage location.

23. The process of claim 22, wherein determining whether the first storage location is available includes using a set of acceptance rules defining the availability of a particular storage location for a particular priority level.

24. The process of claim 22, further including setting a condition level of a particular storage location based on the capacity of the particular storage location.

25. The process of claim 22, further including setting a condition level of a particular storage location based on the operability of the particular storage location.

26. The process of claim 22, wherein responding to the request includes allowing the wafer lot to be stored in the first storage location if the first storage location is available and sending a message identifying an alternate available storage location if the first storage location is unavailable.

27. The process of claim 26, further including determining the available alternate storage location by:

(a) determining a potential alternate storage location; and (b) determining whether the potential alternate storage location is available based on a condition level of the potential alternate storage location and a priority level of the wafer lot.

28. The controller of claim 26, further including means for determining the available alternate storage location by:

(a) determining a potential alternate storage location; and (b) determining whether the potential alternate storage location is available based on a condition level of the potential alternate storage location and a priority level of the wafer lot.

29. A flow controller for controlling the flow of wafer lots within a semiconductor fabrication facility having multiple storage locations, comprising:

means for receiving a request to move a wafer lot to a first storage location;

means for determining, before moving the wafer lot to the first storage location, whether the first storage location is available based on a condition level of the first storage location and a priority level of the wafer lot; and means for responding to the request in accordance with the availability condition the first storage location.

30. The controller of claim 29, wherein means for determining whether the first storage location is available includes means for using a set of acceptance rules defining the availability of a particular storage location for a particular priority level.

31. The controller of claim 29, further including means for setting a condition level of a particular storage location based on the capacity of the particular storage location.

32. The controller of claim 29, further including means for setting a condition level of a particular storage location based on the operability of the particular storage location.

33. The controller of claim 29, wherein means for responding to the request includes means for allowing the wafer lot to be stored in the first storage location if the first storage location is available and means for sending a message identifying an alternate available storage location if the first storage location is unavailable.

34. The controller of claim 29, wherein the multiple storage locations include separate stocking locations disposed within the fabrication facility.

35. The controller of claim 29, wherein the wafer lot is moved automatically to the alternate storage location occurs if the first storage location is unavailable.

* * * * *

UNITED STATES PATENT AND TRADEMARK OFFICE
CERTIFICATE OF CORRECTION

PATENT NO. : 6,411,859 B1
DATED : June 25, 2002
INVENTOR(S) : Conboy et al.

It is certified that error appears in the above-identified patent and that said Letters Patent is hereby corrected as shown below:

Column 3,
Line 14, after "prevent" please delete ",".
Line 24, "implementations" should read -- implementation --.
Line 63, "an number" should read -- a number --.

Column 4,
Line 51, "a early" should read -- an early --.

Column 8,
Line 28, after "condition" please insert -- of --.

Signed and Sealed this

Twenty-sixth Day of November, 2002

Attest:

Attesting Officer

JAMES E. ROGAN
Director of the United States Patent and Trademark Office